United States Patent [19]

Cronin et al.

[11] Patent Number: 4,944,682

[45] Date of Patent: Jul. 31, 1990

[54] METHOD OF FORMING BORDERLESS CONTACTS

[75] Inventors: John E. Cronin; Susan F. Cronin, both of Georgia; Carter W. Kaanta, Colchester; Charles W. Koburger, III, Essex; Stephen E. Luce, Cambridge, all of Vt.; Dale J. Pearson, Carmel, N.Y.

[73] Assignee: International Business Machines Corporation, Armonk, N.Y.

[21] Appl. No.: 453,368

[22] Filed: Dec. 21, 1989

Related U.S. Application Data

[63] Continuation of Ser. No. 254,633, Oct. 7, 1988, abandoned.

[51] Int. Cl.$^5$ .................................... H01L 21/283
[52] U.S. Cl. .................................... 437/192; 437/228; 437/203; 437/245
[58] Field of Search ............... 437/203, 225, 228, 192, 437/187, 189, 180, 245, 246; 156/657, 656, 659.1

[56] References Cited

U.S. PATENT DOCUMENTS

| | | | |
|---|---|---|---|
| 4,631,806 | 12/1986 | Poppert | 437/192 |
| 4,648,175 | 3/1987 | Metz | 437/192 |
| 4,677,736 | 7/1987 | Brown | 437/192 |

Primary Examiner—Olik Chaudhuri
Assistant Examiner—Kevin McAndrews

[57] ABSTRACT

A method of forming semi-conductor devices components wherein there are at least two exposed conducting regions having passivating material overlying said regions. The passivating material is subject to etching by a given etchant. At least one, but less than all of the regions are covered with a material, preferably an electrical conducting material, which also preferably covers additional electrical conducting or semi-conducting regions. Thereafter, all the regions are subjected to the given etchant, but only those regions having the passivating material not covered with the etch resistant material are removed. Preferably, at this point, a layer of conducting material is deposited over all the regions.

10 Claims, 2 Drawing Sheets

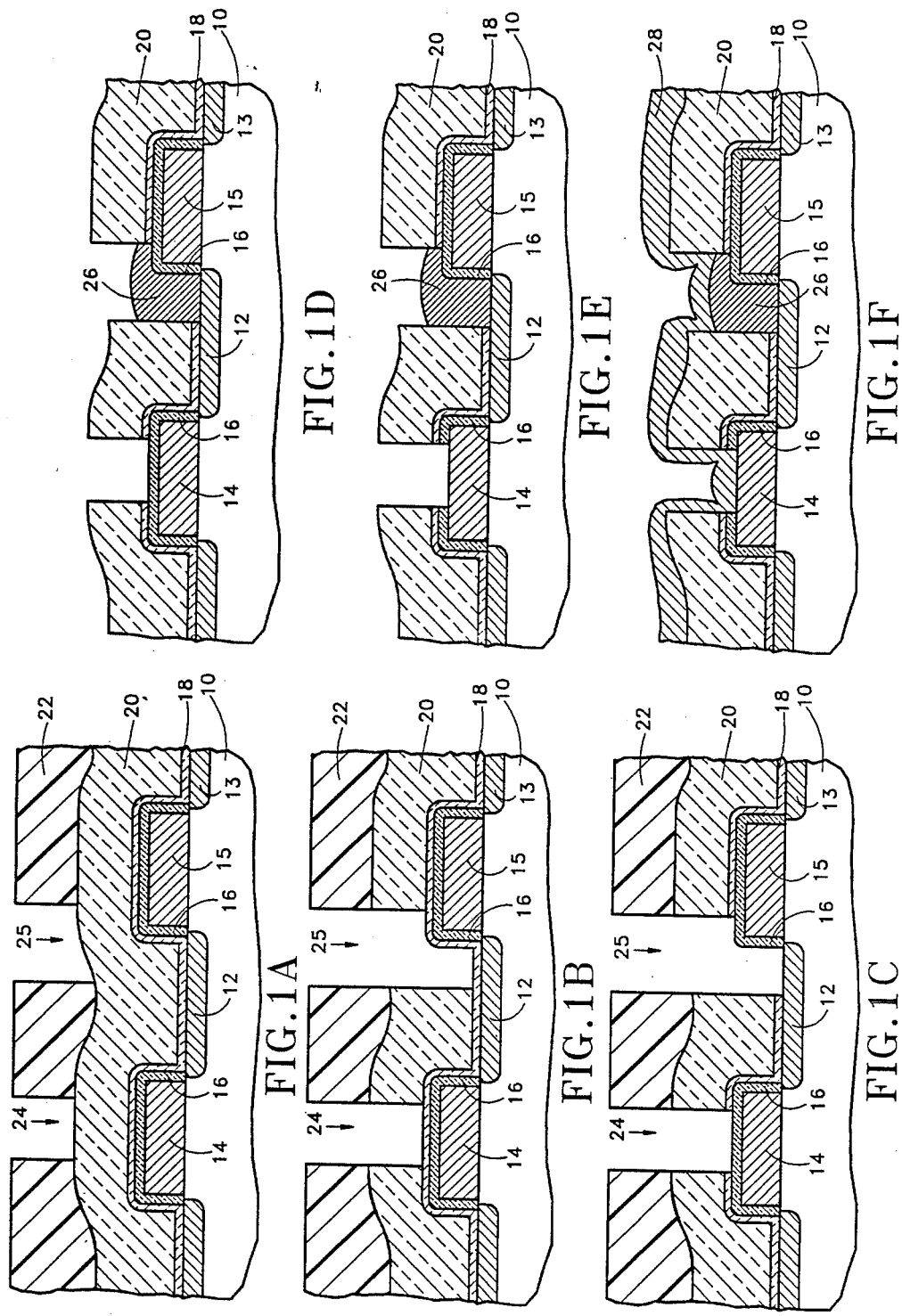

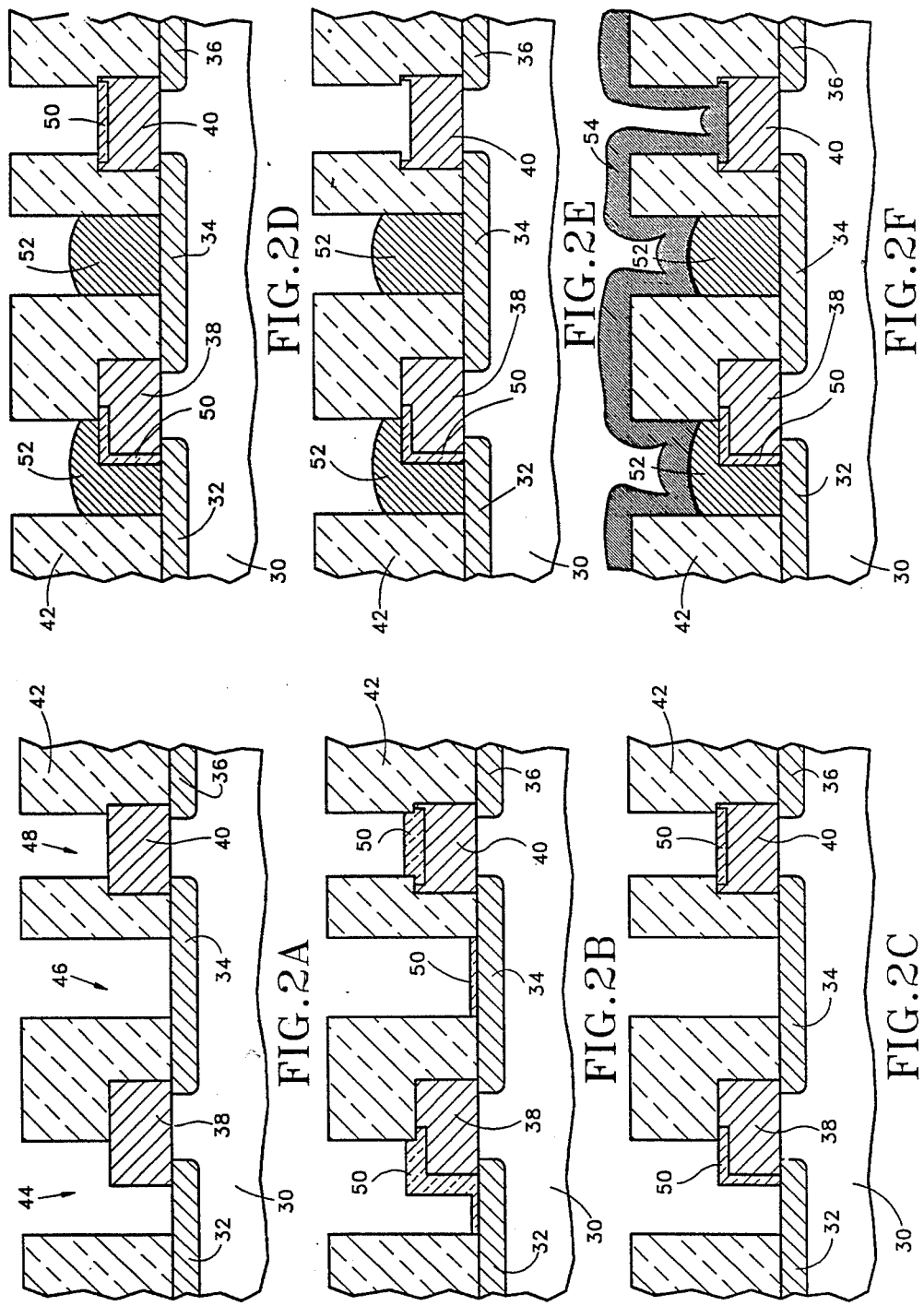

METHOD OF FORMING BORDERLESS CONTACTS

BACKGROUND OF THE INVENTION

1. Field of the Invention

This invention relates generally to the fabrication of semi-conductor devices, by photo lithographic processes and more particularly to preventing unwanted electrical contact between different regions of the semiconductor devices.

In the formation of semi-conductor devices it is necessary to both provide desired electrical contact between certain regions of the devices formed and also to prevent contact between various other regions of the devices formed on the substrate. Conventionally, one technique for accomplishing this is by utilizing photoresist and masking techniques wherein those areas to be exposed for electrical contact are patterned in the photoresist, and then by developing the patterned photoresist, to thereby expose the desired underlying regions. This technique normally requires several successive masks to perform the entire process, and in its performance each succeeding mask must be precisely aligned with the previously exposed and developed structure to insure that only the desired regions are ultimately exposed, and other regions remain covered or protected, or additional masking may be required. However, as the technology advances, allowing for formation of smaller and smaller devices, it is increasingly difficult to maintain precise overlay tolerance, with the result that even small misalignments of the masks will result in the exposure of small portions or "borders" of regions that are intended to remain covered. Hence, electrical connections, e.g. by an overlay deposition of a metal will connect not only the desired locations but also those exposed border portions of the undesired locations.

Thus it is a principal object of this invention to provide a technique applicable to the production of semiconductor devices by photolithographic processes in which exposed regions of the same material, such as polysilicon, can be selectively masked to prevent unintended contact with the selectively masked regions thus providing what are known as borderless contacts.

DESCRIPTION OF THE DRAWINGS

FIGS. 1A-1F are sectional views, somewhat diagrammatic, showing the sequence of steps and processes to selectively protect a desired region on a semiconductor chip according to this invention; and FIGS. 2A-2F are sectional views somewhat diagrammatic, of a sequence of steps and processes similar to FIGS. 1A-1F of another embodiment of this invention.

DESCRIPTION OF THE PREFERRED EMBODIMENTS

Referring now to the drawings, and for the present to FIGS. 1A through 1F, a diagrammatic representation of the steps of one embodiment of this invention is shown. FIG. 1A shows a typical semiconductor fabrication at the stage of processing wherein a silicon substrate 10 has been provided with diffusion or doped regions 12, 13 and conducting layers 14, 15 preferably of polysilicon which will form gate electrodes in the semi-conductor devices which are to be formed on the silicon substrate. The conducting layers 14, 15 have electrically insulating layers 16 capping them, which insulating layers may be oxides, nitrides, or the like. A process for forming a capping layer is as follows: a layer of polysilicon is paterned by photoresist techniques with an oxide or nitride mask. The polysilicon is etched, leaving the mark and underlying polysilicon in tact. Side wall oxide insulators are formed by CVD oxide deposition and RIE etch (as will be described presently); all as is well known in the art. Overlying the entire surface of the chip is an etch-stop passivation layer 18. This may be aluminum oxide, or the like. This can be applied by reactive sputtering. A smoothing layer of reflowed glass 20 overlies the etch stop layer 18. On top at the glass layer 20 is a photoresist material 22 which has been exposed through a mask and developed to produce a series of openings 24, 25 in a conventional manner. Under ideal conditions, the mask used to pattern the photoresist would have had the exact size and shape, and been exactly positioned to expose the conducting layer 14 and diffused area 12, but leave covered the conducting layer 15. However, as was described above, this is not always the case, and these series of FIGS. 1A-1F demonstrate how the exposed portion of conductor 15 can be protected while the conductor 14 and diffusion area 12 are exposed for electrical contact.

The glass 20 which is exposed through the openings 24, 25 is etched using reactive ion etching in gasses such as $CHF_3+CO_2$ or $CH_4$ at low pressure, e.g. about 100 mil Torr or less, which etching is stopped by etch stop layer 18 as shown in FIG. 1B. The exposed etch stop 18 is removed by reactive ion etching in $BCl_3$ at low pressure, e.g. 100 mil Torr or less as shown in FIG. 1C. This reveals a portion of the insulating layer 16 overlying a portion of the conducting layer 14 and also the insulating layer overlying one edge portion of the conducting layer 15 and a portion of diffusion area 12 as depicted in FIG. 1C. At this point it is desired to create an electrical contact with conducting layer 14 and diffusion layer area 12, but keep conducting layer 15 electrically insulated. This is accomplished by the following steps which start with the selective deposition and growth of a conducting material such as tungsten on the exposed diffusion areas 12 as shown at 26 in FIG. 1D. A preferred technique of the selective deposition and growth of tungsten is as follows: This is accomplished by low pressure (e.g. 200 mil Torr or less) CVD growth of tungsten utilizing $WF_6$ and $H_2$ gasses at a temperature of about 500° C. or less.

The tungsten is selectively deposited onto the diffusion region 12 and grown so that it completely covers the capped portion of the conductor 15 which is exposed as shown in FIG. 1D. At this point, the tungsten 26 provides an electrical connection to the diffusion region 12, but is electrically insulated from the conducting layer 15 by the insulating layer 16 formed thereon. The tungsten 26 also protects the insulating layer 16 on conducting layer 15 from exposure, which is critical for the next step of the process.

In the next step of the process, the exposed insulating layer 16 overlying the conducting layer 14 is removed by blanket etch to expose the surface of the conducting layer 14 which will result in the structure shown in FIG. 1E. A preferred etch process is the same process as used to remove layer 20 as previously described.

At this point in the process the conducting layer 14 is exposed, as desired. Diffusion region 12 is covered by tungsten 26. Conducting layer 15 is electrically insulated by virtue of insulating layer 16 which was protected from removal during the blanket etch by the tungsten 26. A blanket deposition of metal 28 can now be performed as shown in FIG. 1F to provide electrical connection to conducting layer 14 and diffusion region 12. This can be conventionally sputtered aluminum, or certain aluminum alloys, or any other desired metal. After the aluminum is deposited, it is masked, patterned and etched to define a conductor layer in a conventional manner.

Another embodiment of the invention is shown in FIGS. 2A through 2E. In FIG. 2A, a silicon substrate 30 is shown having diffusion regions 32, 34, and 36. Conducting layers 38, 40 of polysilicon are deposited on the silicon substrate 30. An overlying glass layer 42 has been patterned and etched by photoresist methods as previously described to form openings 44, 46, and 48, all as shown in FIG. 2A. In this case, it is desired to provide electrical contact to diffusion regions 32 and 34, and conducting layer 40, and prevent electrical contact to conducting layer 38. Again, the exposure of a portion of the conducting layer 38 is not desired, but is due to misalignment of the mask.

In this embodiment, a thermal oxide 50 is grown on diffusion regions 32 and 34 and on conducting layers 38 and 40. This is done in an oven at 800° C. or less in an oxygen atmosphere. In this embodiment, reliance is made on the fact that the thermal oxide grows about three times as fast on polysilicon layers 38 and 40 as on the diffusion regions 32, 34 which are each a single crystal. The resulting structure is shown in FIGS. 2B. The thermally grown oxide is reactively ion etched (RIE), with etching being stopped after the oxide is completely removed from the diffusion zones 32, 34, but before it is removed from the polysilicon layers 38, 40 as shown in FIG. 2C. A suitable process for RIE is the same as used to etch layer 20 as described above.

From this point on, the processing is identical to that as previously described. A metal 52 such as tungsten is selectively deposited and grown on diffusion regions 32 and 34. The growth of the tungsten in diffusion region 34 grows to cover the edge of conducting layer 38 and is insulated therefrom by insulating oxide 50 but does not grow on oxide 50 overlying conducting layer as shown in FIG. 2D. The oxide 50 overlying conducting layer 40 is removed by a blanket RIE etch as was used to remove layer 20 as described above, which does not affect the oxide layer 50 overlying the edge portion of conducting layer 38 which is protected by the tungsten as shown in FIG. 2E, and a blanket deposition of metal, such as aluminum is applied, by sputtering as previously described. The result is as shown in FIG. 2F. This results in connection to conductor 34, 40, 32, and protects conductor 38.

Although the invention has been described in some detail, various adaptions and modifications can be made without departing from the scope as defined in the appended claims.

SUMMARY OF THE INVENTION

An improved process of forming semi-conductor components on a substrate material is provided wherein there are at least two regions of material to be electrically connected and at least one additional region, of the same material as at least one of said regions, which is to be electrically insulated. The regions are all covered with an insulating material which can be etched by a given etchant, and thereafter the region or region which are to remain electrically insulated are covered with an additional material which resists the etchant. Thereafter the entire surface is exposed to the etchant, which will remove the additional material at the locations wherein the insulation material is exposed but not remove the insulating material at the locations covered by the additional material.

What is claimed is:

1. In the process of forming semiconductor components on a substrate material, and wherein there are at least two exposed regions having an overlying passivating material which is subject to etching by a given etchant, the improvement comprising; selectively depositing in at least a portion of a selected one but less than all of said exposed regions a material that resists said etchant, and thereafter exposing all of the regions to said etchant, whereby only said regions without said etch resisting material will be etched.

2. The invention as defined in claim 1, wherein said etch resisting material is selectively grown to cover said portion of said selected one of said exposed regions.

3. The invention as defined in claim 2, wherein the regions which are covered with said etch resisting material include a second material which differs from passivating material, and which second material supports the growth of said etch resisting material and said passivating material resists the growth of said etch resisting material, and wherein said etch resisting material is grown only in each region which has said second material and regions which have said passivating material and said second material and said etch resisting material covers both of said regions.

4. The invention as defined in claim 3, wherein said passivating material is an insulator and said second material is a semi-conductor.

5. The invention as defined in claim 4 wherein the passivating layer is a deposited capping layer.

6. The invention as defined in claim 4 wherein the passivating layer is a thermally grown oxide.

7. The invention as defined in claim 5 wherein the semi-conductor is doped silicon.

8. The invention as defined in claim 7, wherein the etch resisting material is a selectively grown metal.

9. The invention as defined in claim 8, wherein the metal is tungsten.

10. A process for forming borderless contacts on a semiconductor substrate having a plurality of gate electrodes disposed on an exposed surface thereof, each of the plurality of gate electrodes having sidewalls covered by insulating sidewall spacers and an upper surface covered by an insulating cap, comprising the steps of: forming a passivation layer on the exposed surface of the substrate; etching through selected portions of the passivation layer to expose the insulating cap of selected ones of the plurality of gate electrodes and to expose regions of the substrate adjacent to each of the plurality of gate electrodes; selectively forming a first conductor on said exposed regions of the substrate and the insulating cap on the adjacent gate electrode; treating the substrate in an etchant that removes the exposed insulator caps without appreciably etching said first conductor, to expose said selected ones of the plurality of gate electrodes; and forming a second conductor on said selected ones of the plurality of gate electrodes.

* * * * *